US010832993B1

(12) United States Patent
Dadvand et al.

(10) Patent No.: US 10,832,993 B1
(45) Date of Patent: Nov. 10, 2020

(54) PACKAGED MULTICHIP DEVICE WITH STACKED DIE HAVING A METAL DIE ATTACH

(71) Applicant: Texas Instruments Incorporated, Dallas, TX (US)

(72) Inventors: Nazila Dadvand, Richardson, TX (US); Sreenivasan Koduri, Allex, TX (US); Benjamin Stassen Cook, Addison, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/408,108

(22) Filed: May 9, 2019

(51) Int. Cl.
*H01L 23/495* (2006.01)
*H01L 23/00* (2006.01)
*H01L 21/56* (2006.01)
*H01L 23/31* (2006.01)

(52) U.S. Cl.
CPC ...... *H01L 23/49548* (2013.01); *H01L 21/565* (2013.01); *H01L 23/3121* (2013.01); *H01L 23/49575* (2013.01); *H01L 24/09* (2013.01); *H01L 24/49* (2013.01)

(58) Field of Classification Search
CPC ............... H01L 23/49575; H01L 24/49; H01L 23/49838; H01L 23/53233; H01L 23/49811; H01L 21/4825; H01L 21/4853; H01L 23/49822; H01L 21/4821
See application file for complete search history.

(56) References Cited

U.S. PATENT DOCUMENTS

| | | | |
|---|---|---|---|
| 2009/0001534 A1* | 1/2009 | Yu | H01L 24/06 257/676 |
| 2010/0084175 A1* | 4/2010 | Suzuki | H05K 1/0231 174/260 |
| 2011/0227233 A1 | 9/2011 | Wainerdi et al. | |
| 2012/0199960 A1* | 8/2012 | Cosue | H01L 23/4985 257/668 |
| 2013/0286565 A1* | 10/2013 | Tsuduki | H01L 23/10 361/679.01 |
| 2013/0286566 A1* | 10/2013 | Tsuduki | H05K 5/0091 361/679.01 |
| 2013/0313726 A1 | 11/2013 | Uehling | |
| 2014/0240588 A1* | 8/2014 | Sakuragi | H01L 23/10 348/373 |

(Continued)

*Primary Examiner* — Changhyun Yi
(74) *Attorney, Agent, or Firm* — Ronald O. Neerings; Charles A. Brill; Frank D. Cimino

(57) ABSTRACT

A leadless multichip semiconductor device includes a metal substrate having a through-hole aperture with an outer ring for holding a bottom semiconductor die with an inner row and an outer row of metal pads. The bottom semiconductor die has a back side metal (BSM) layer on its bottom side and a top side with bond pads mounted top side up on the ring. A metal die attach layer is directly between the BSM layer and walls of the metal substrate providing a die attachment that fills a bottom portion of the aperture. Bond wires are between the inner metal pads and the bond pads. A top semiconductor die has top bond pads mounted top side up on a dielectric adhesive on the bottom semiconductor die. Pins connect the top bond pads to the outer metal pads. A mold compound provides isolation between adjacent ones of the metal pads.

17 Claims, 5 Drawing Sheets

(56) References Cited

U.S. PATENT DOCUMENTS

2014/0268594 A1* 9/2014 Wang .................... H05K 1/189
                                                        361/749
2017/0178998 A1   6/2017 Jeun et al.
2018/0172504 A1*  6/2018 Gambart ............... G01J 1/0204

* cited by examiner

PACKAGED MULTICHIP DEVICE WITH STACKED DIE HAVING A METAL DIE ATTACH

CROSS-REFERENCE TO COPENDING APPLICATIONS

This application has subject matter related to application Ser. No. 16/026,371 entitled "SEMICONDUCTOR DEVICE WITH ELECTROPLATED DIE ATTACH" that was filed on Jul. 3, 2018.

FIELD

This Disclosure relates to semiconductor device assembly, more specifically to metal die attachment to a substrate.

BACKGROUND

Packaged semiconductor devices generally comprise at least one integrated circuit (IC) die which is conventionally a silicon die that is mounted on a die pad of a workpiece such as a lead frame using a die attach adhesive. Other workpieces include an interposer, a printed circuit board (PCB), and another IC die. For IC die assembled top (active) side up and back side down, the die attach adhesive provides a mechanical attachment, and generally also provides an electrical and/or thermal pathway to the die pad. The die attach adhesive generally comprises a polymer such as a polyimide or an epoxy-based adhesive. Silver is often added in particle flake form as a filler to raise both the electrical conductivity and the thermal conductivity of the polymer material.

Packaged multichip devices are known with laterally positioned IC die, or with vertically stacked IC die that form a packaged three-dimensional integrated circuit (3D IC). Such packaged multichip devices generally include the same die attach as described above for single die semiconductor packages.

SUMMARY

This Summary is provided to introduce a brief selection of disclosed concepts in a simplified form that are further described below in the Detailed Description including the drawings provided. This Summary is not intended to limit the claimed subject matter's scope.

This Disclosure recognizes conventional die attach solutions comprising metal particle filled polymers have significant thermal and electrical resistance. Since thermal management is becoming more important with the trend for more compact and more highly integrated electronic systems having smaller features and running at higher operating currents, higher thermal conductivity die attach arrangements are needed that also provide a low electrical resistance when back side electrical contact to the semiconductor die is used. It is recognized that although solder die attach, such as eutectic gold (Au), and Au-tin (AuSn), can provide back side electrical contact to the semiconductor die with relatively good thermal and electrical resistance as compared to metal particle filled polymers, solder die attach is relatively expensive, and is limited to solderable die surfaces. Moreover the solder die attach process involves an inert reflow at temperatures that can cause temperature induced stresses to the semiconductor die's metal interconnect.

Disclosed aspects include a leadless packaged multichip semiconductor device including a metal substrate having a through-hole aperture with an outer ring for holding a bottom semiconductor die with a row of inside metal pads and a row of outside metal pads. The bottom semiconductor die has a back side metal (BSM) layer on its bottom side and a top side with circuitry coupled to bond pads mounted top side up on the ring. A metal die attach layer is directly between the BSM layer and walls of the metal substrate providing a die attachment that fills a bottom portion of the aperture. Bond wires are between the inner metal pads and the bond pads. A top semiconductor die has top bond pads mounted top side up on a dielectric adhesive on the bottom semiconductor die. Pins connect the top bond pads to the outer metal pads. A mold compound provides isolation between adjacent ones of the metal pads.

BRIEF DESCRIPTION OF THE DRAWINGS

Reference will now be made to the accompanying drawings, which are not necessarily drawn to scale, wherein.

DETAILED DESCRIPTION

Figure 1A:
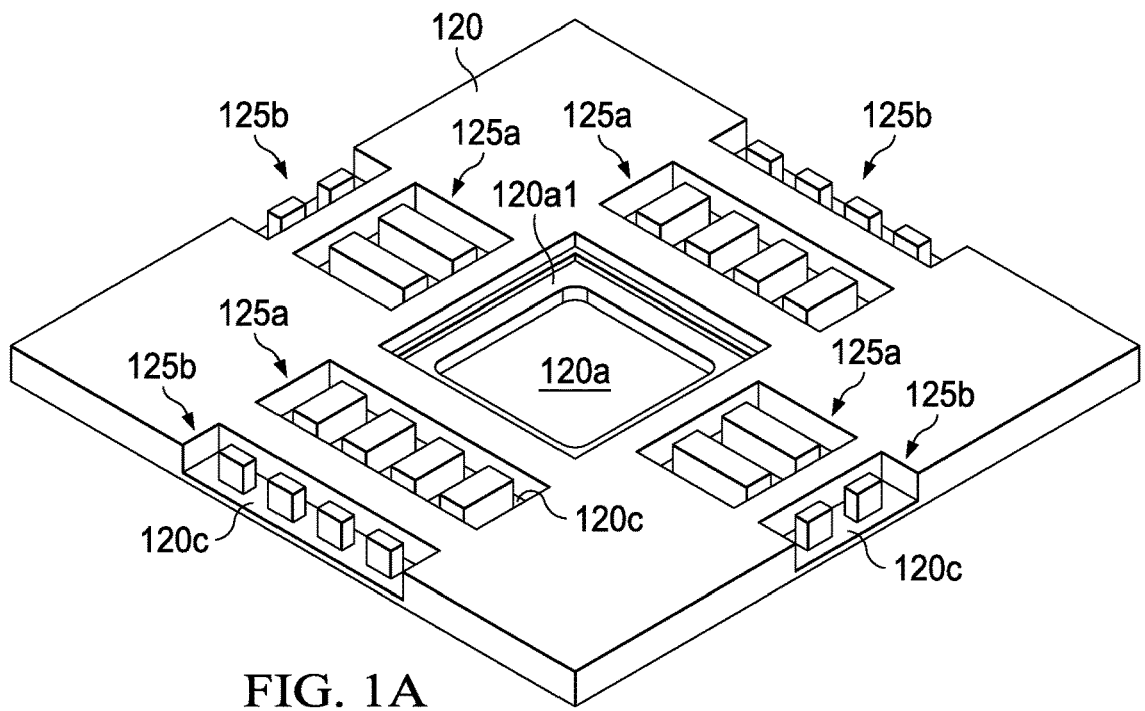
FIG. 1A shows an example metal substrate having a through-hole aperture and a row of inner metal pads and a row of outer metal pads for a 12 pin quad flat no lead (QFN) type stacked multichip package.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Figure 1B:
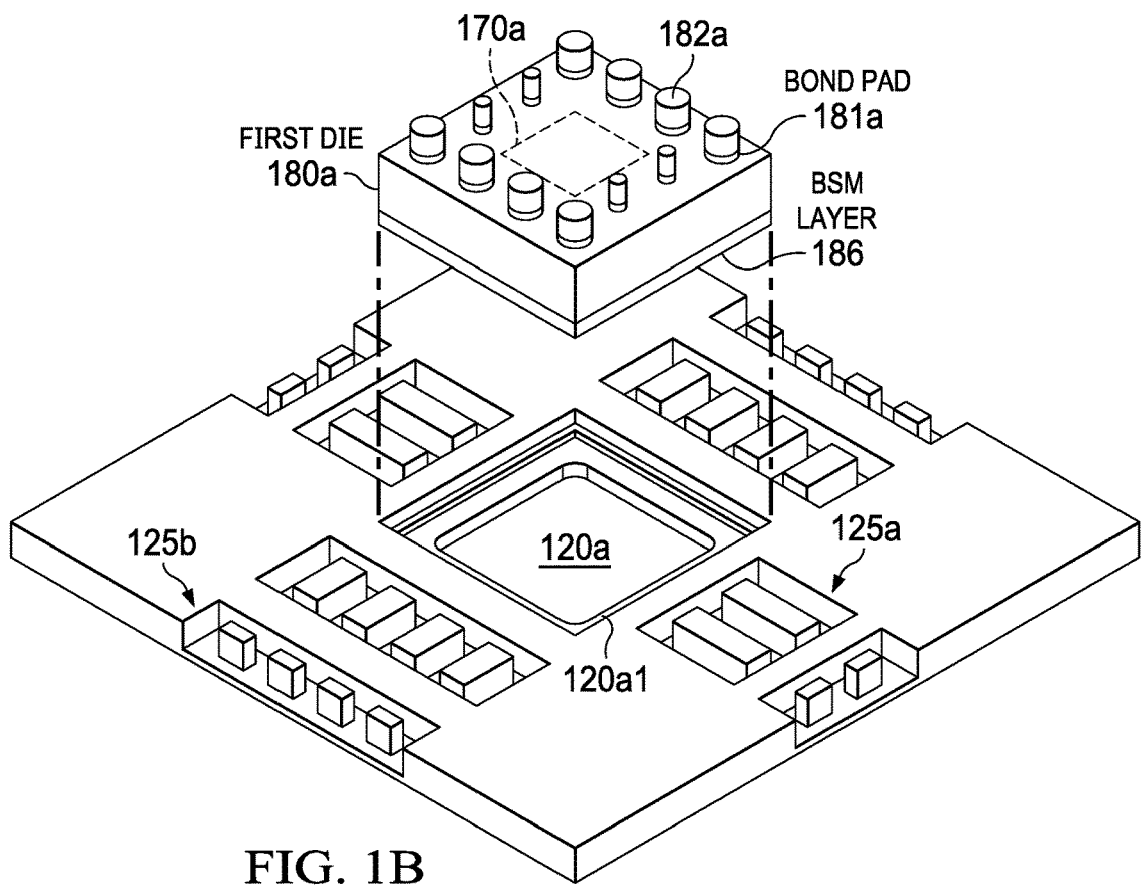
FIG. 1B shows a bottom semiconductor die having a BSM layer just before placement top side up onto the metal substrate to be supported by an outer ring framing the through-hole aperture.
Figure 1C:
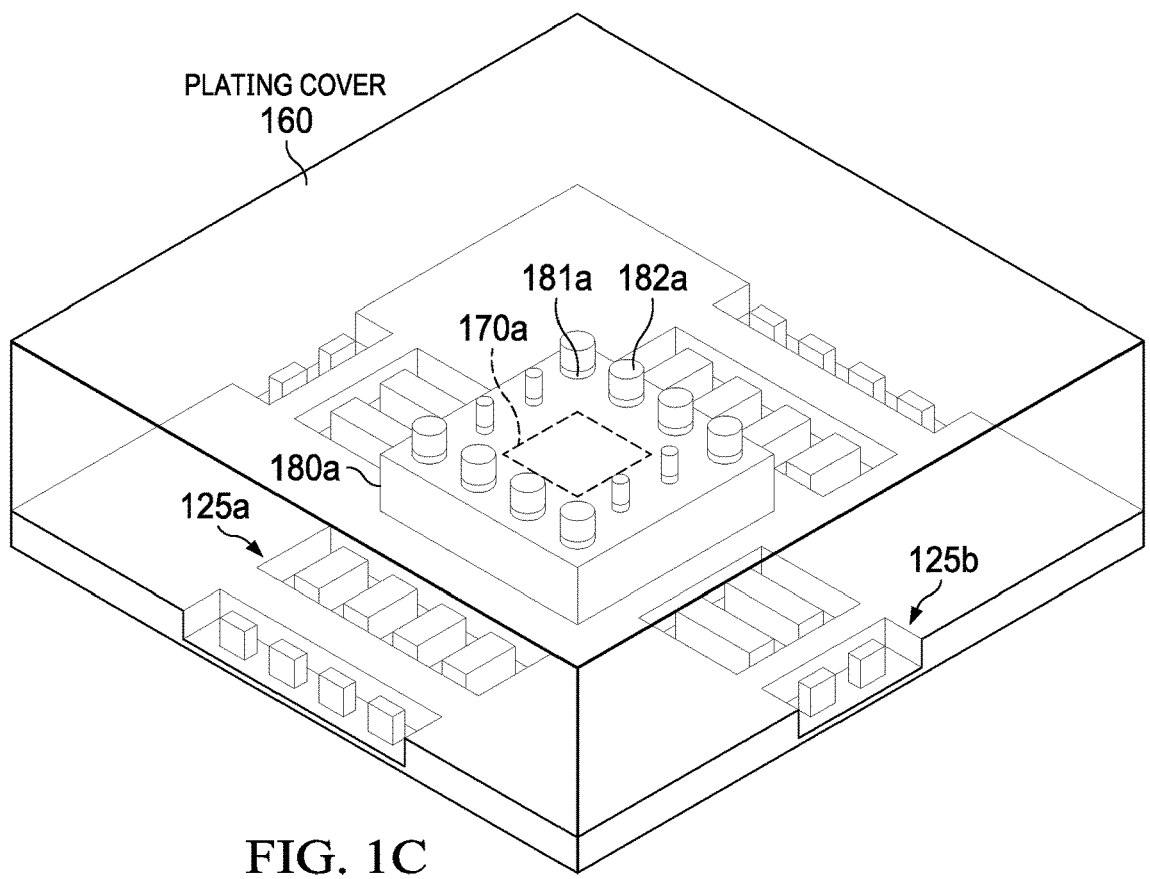
FIG. 1C shows the in-process leadless packaged multichip device after inserting a plating cover over the top side of the bottom semiconductor die.
Figure 1D:
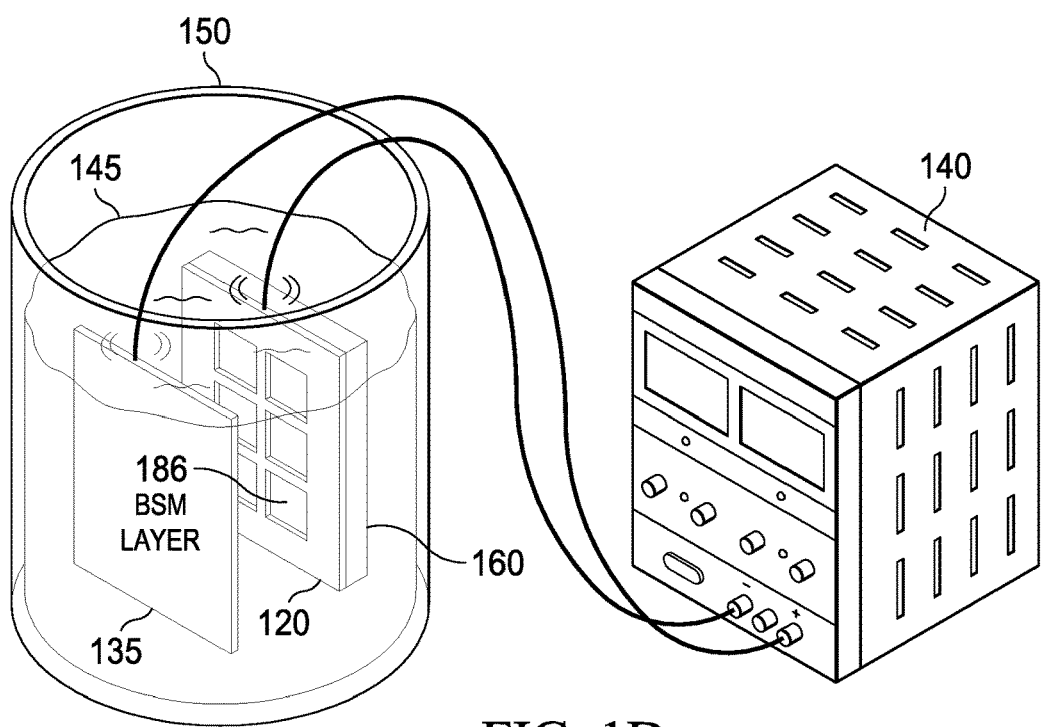
FIG. 1D shows a plating apparatus comprising a power supply along with electrical connections to the metal substrate and to a spaced apart anode for plating the back side of a bottom semiconductor die shown immersed into a plating container that provides an electroplating bath including a plating solution for forming a disclosed plated metal die attach layer.
Figure 1E:
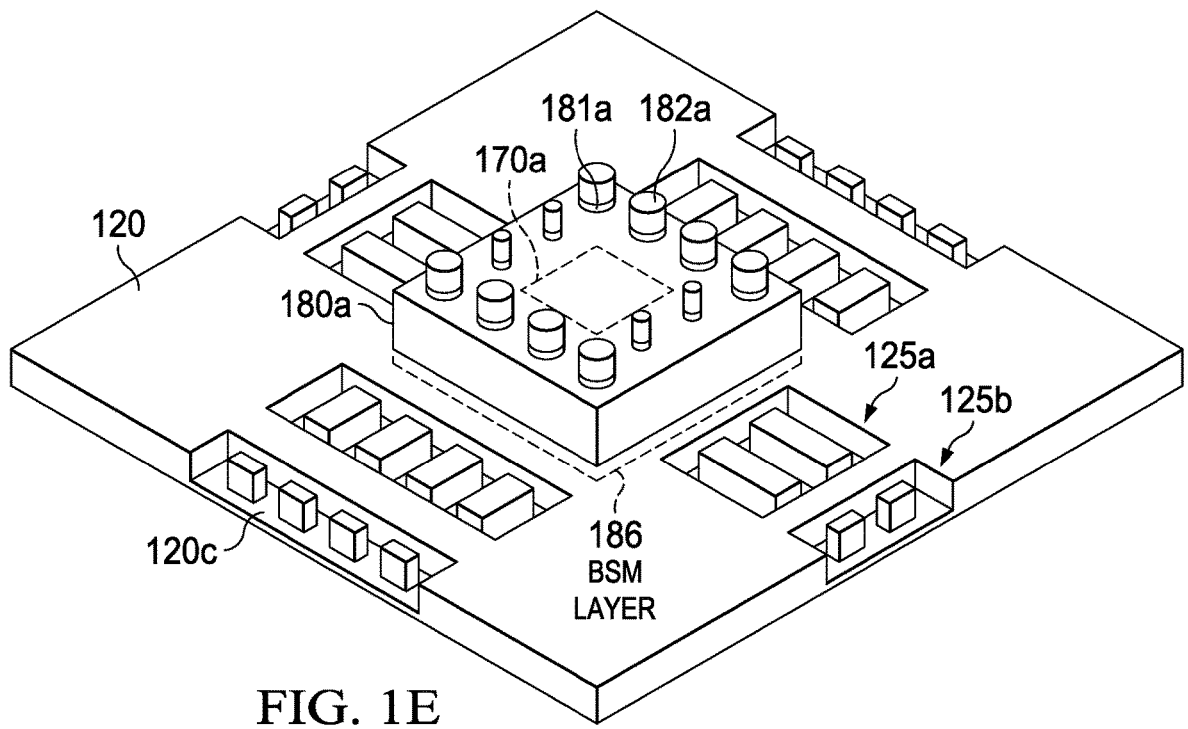
FIG. 1E shows the in-process leadless packaged multichip device after removing the plating cover.
Figure 1F:
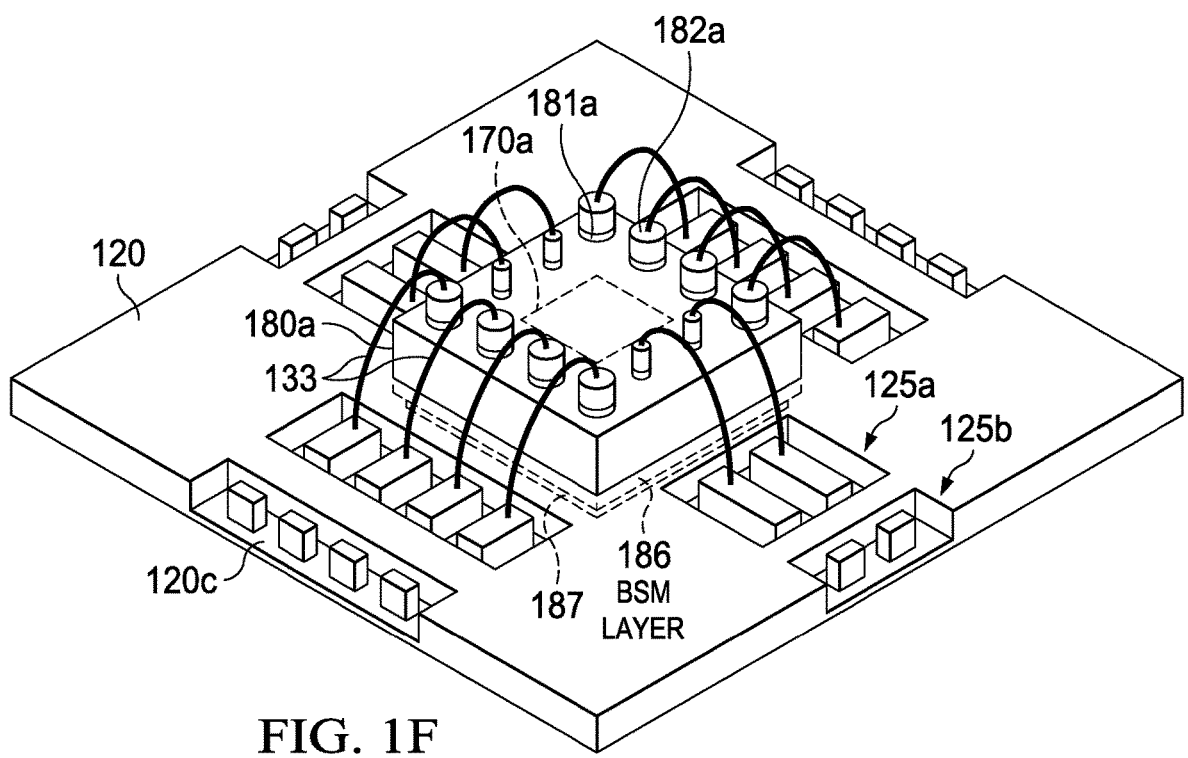
FIG. 1F shows the in-process leadless packaged multichip device after wire bonding to provide bond wires between the example pillars shown on the bond pads of the bottom semiconductor die and the inner metal pads of the metal substrate.
Figure 1G:
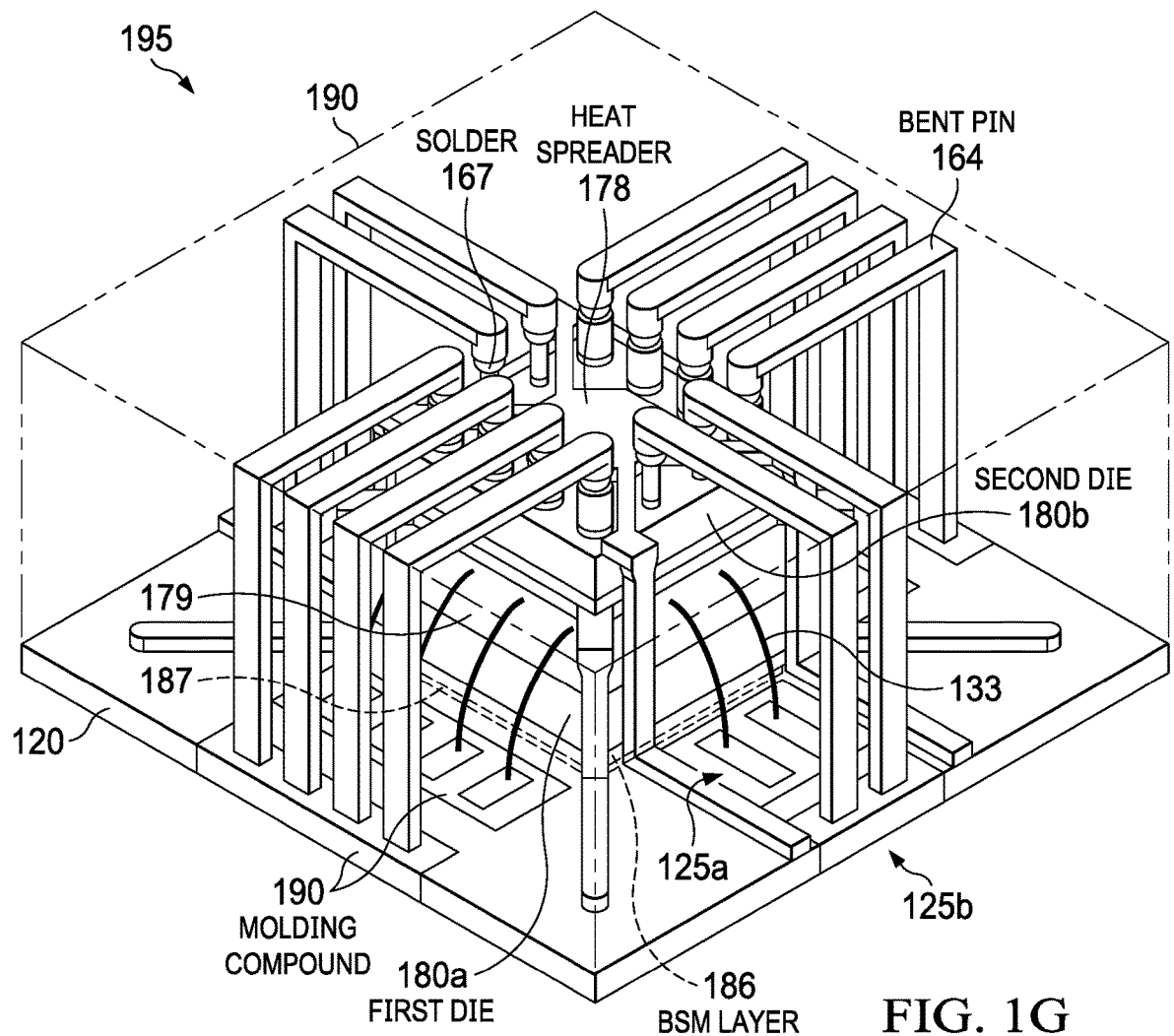
FIG. 1G is a top perspective view of the packaged multichip device having stacked die on the metal substrate.
Figure 1H:
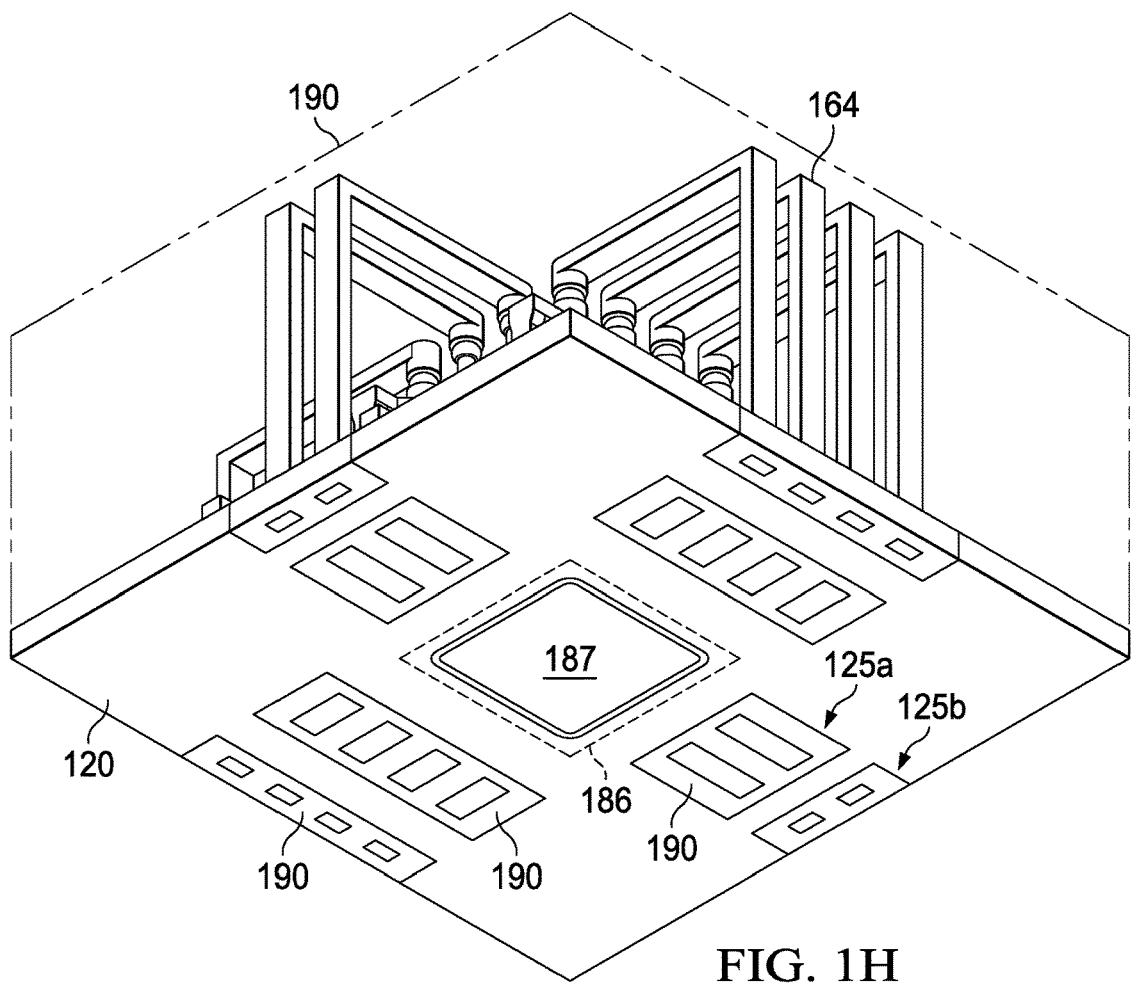
FIG. 1H is a bottom view of the packaged multichip device shown in FIG. 1G, where a disclosed metal die attach layer is shown over the BSM layer on the back side of the bottom semiconductor die.

FIGS. 1A-H show successive cross-sectional depictions for an example assembly method for forming a disclosed leadless packaged multichip device having vertically stacked semiconductor die on a metal substrate that has a through-hole aperture that has an outer ring and at least two rows of metal pads including an inner row and outer row, with a plated metal die attach layer (die attach layer 187) for attaching a bottom semiconductor die having a BSM layer to metal substrate. There is a top semiconductor die stacked on the bottom semiconductor die. Bond pads on the bottom semiconductor die are wirebonded to the inner metal pads, and bond pads on the top semiconductor die are coupled (such as by bent metal pins) to the outer metal pads, where the metal pads are electrically isolated from one another by a mold compound. FIG. 1G is a top perspective view of the packaged multichip device 195 having stacked die 180*b* on 180*a* on a metal substrate 120, and FIG. 1H is a bottom view of the packaged multichip device shown in FIG. 1G, where the metal die attach layer 187 in FIG. 1H over the BSM layer 186 on the back side of the bottom semiconductor die 180*a*. As used herein, a 'ring' as used herein in the phrase an "outer ring" means an enclosed shape, such as being substantially circular including shapes such as elliptical, rectangular, or square.

The metal substrate 120 is provided generally in the form of a leadframe panel or leadframe sheet including a plurality of the same interconnected metal substrates 120. FIG. 1A shows an example metal substrate 120 including a through-hole aperture 120*a* that has an outer ring 120*a*₁ configured for receiving the bottom semiconductor die 180*a*, and two rows of metal pads including an inner row of metal pads (inner metal pads) 125*a* and an outer row of metal pads (outer metal pads) 125*b*. The through-hole aperture 120*a* is sized with area dimensions to receive the bottom semiconductor die 180*a* on the ring 120*a*₁ for holding the bottom semiconductor die 180*a*.

The metal substrate 120 includes thinned regions referred to herein as partial etched regions 120*c* that are between full thickness metal portions of the metal substrate 120, which as noted above will after disclosed back side metal etching become spaced apart inner metal pads 125*a*, and outer metal pads 125*b*. The "partial etched regions" can be, but need not be, formed by an etching process. Shown in FIG. 1A is an example leadframe for a 12 pin QFN type stacked multichip package, that is referred to as a "QFN type" package because it has two rows of metal pads/lead terminals unlike a conventional QFN package that has only a single role of metal pads/lead terminals.

As described below, the bottom semiconductor die 180*a* will be positioned into the through-hole aperture 120*a* and placed so that its outer edges are on the ring 120*a*₁. The metal substrate 120 generally comprises copper (Cu) or a Cu alloy, and the metal substrate 120 may be 150 µm to 350 µm thick. As noted above, although only one metal substrate 120 is shown, there are generally a plurality of interconnected metal substrates in the form of the substrate sheet or substrate panel. Disclosed metal substrates may be fabricated from copper or copper alloy by a patterning and etching process. The patterning and etching process forms the through hole aperture(s) 120*a*, and the partial etched regions 120*c* between the metal pads 125*a*, 125*b* which as described below will be back side etched through to expose the mold compound (shown below as 190) that fills the via-like structures in the partial etch regions 120*c*, where after back side etching the mold compound electrically isolates the adjacent ones of the metal pads 125*a*, 125*b* from one another.

The partial etched regions 120*c* can be formed by stamping, etching or by another suitable metal thinning process. The partial etched regions 120*c* can have a thickness that is less than 20% of a thickness of the metal pads 125*a*, 125*b*, before the below-described backside etching used to electrically isolate the metal pads, with a typical thickness range of 1% to 20% of the thickness of the metal pads (e.g., 2 to 70 µm thick partial etched regions 120*c*) before the below-described backside etching.

The bottom semiconductor die 180*a* is inserted top (active) side up with its BSM layer 186 to be held by the ring 120*a*₁ within the through-hole aperture 120*a*. FIG. 1B shows the bottom semiconductor die 180*a* having a BSM layer 186 just before placement (e.g., pick and place) top side up onto the metal substrate 120 to be supported by the outer ring 120*a*₁ framing the through hole aperture 120*a*. The BSM layer 186 may comprise Cu and can be 6 µm to 10 µm thick.

Before forming the BSM layer 186, the back side of the wafer including a plurality of the bottom semiconductor die 180*a* may be thinned, such as using a back grinding process to a thickness of 200 to 350 µm, followed by optionally forming of a refractory metal layer (not shown) such as comprising a TiW layer. The top side of the bottom semiconductor die 180*a* includes circuitry 170*a* coupled to bond pads 181*a* and a back side with a BSM layer 186 thereon. The circuitry 170*a* (and circuitry 170*b* described below for the top semiconductor die 180*b*) comprises circuit elements (including transistors, and generally diodes, resistors, capacitors, etc.) formed in a semiconductor layer (e.g., an epitaxial layer on a bulk substrate) configured together for generally realizing at least circuit function. Example circuit functions include analog (e.g., amplifier or power converter), radio frequency (RF), digital, or non-volatile memory functions. The bond pads 181*a* can include Cu pillars with pillars shown as 182*a* or solder bumps thereon.

Before plating the metal die attach layer 187 on the BSM layer 186, below the ring 120*a*₁ on sidewalls of the metal substrate 120, and on the back side of the bottom semiconductor die 180*a*, the top side of the bottom semiconductor die 180*a* is protected from the subsequent plating by a plating cover. The plating cover can comprise a plastic that has features that fit within the partial etch regions 120*c*. For example the top side of the bottom semiconductor die 180*a* can be covered by a plastic cover which is then taped to be secured, or by an ultraviolet (UV) light curable tape, in order to prevent plating from occurring on the top side of the bottom semiconductor die 180*a*. A plating cover 160 also prevents the bottom die 180*a* from falling off when inside the plating solution during electroplating.

The result of inserting a plating cover 160 over the top side of the bottom semiconductor die 180*a* is shown in FIG. 1C, where as described above the plating cover 160 is generally contoured to also fit within the partial etch regions 120*c*. The plating cover 160 in the case of a plastic cover is generally configured to have dimensions to fit over the bottom semiconductor die 180*a* and fit within the thinned metal substrate regions 120*a*, typically used along with a tape for sealing the edges of the bottom semiconductor die 180*a*. Alternatively, although not shown, a tape alone may be used as the plating cover 160.

At least the BSM layer 186 of the bottom semiconductor die 180*a* and a bottom side of the metal substrate 120 are immersed into a plating container 150 that provides an electroplating bath including a plating solution 145, with the plating apparatus shown with a power supply 140 along with electrical connections to the metal substrate 120 and to a spaced apart anode 135 as shown in FIG. 1D. In FIG. 1D the entire bottom semiconductor die 180*a* is shown within the plating solution 145. As a result of the plating process the metal die attach layer 187 is plated on the BSM layer 186 on the back side of the semiconductor die 180*a*, the walls of the metal substrate under the ring 120a, and the bottom side of the metal substrate 120, where the BSM layer 186 on the bottom semiconductor die 180a becomes attached to the metal substrate 120 due to the presence of the metal die attach layer 187. The metal die attach layer 187 generally consists of a single layer.

The metal die attach layer 187 can comprise Cu or other electrically conductive material such as nickel, cobalt, or alloys thereof. The partial etch regions 120c being thinned regions of the metal substrate 120 as described above will be filled with mold compound 190 during molding, so that after back side metal etching described below etches through the partial etch regions 120c (after etching the metal die attach layer 187) to expose the mold compound which electrically isolates adjacent ones of the metal pads (inner metal pads 125a and outer metal pads 125b) from one another in the final leadless packaged multichip device, such as leadless packaged multichip device 195 shown in FIG. 1G and FIG. 1H described below.

The plating solution 145 includes an electrolyte containing one or more dissolved metal salts including the metal (e.g., Cu) of interest to electroplate as well as other ions that permit the flow of electricity. As noted above there may also be a sealant, such as electroplating solution resistant tape between the holder 160 and the metal substrate 120 to avoid plating metal on the top side of the bottom semiconductor die 180a. For electroplating, the metal substrate 120 is connected to a negative terminal (cathode) of a power supply 140, and an electrically conductive structure spaced aperture from the metal substrate 120 such as a metal block that functions as an anode 135 that is positioned apart from the metal substrate 120 that is connected to a positive terminal (anode) of the power supply.

The electroplating is generally performed at a temperature from 15° C. to 30° C. to avoid introduction of temperature induced stresses, such as to the bottom semiconductor die's 180a metal interconnect on its top side. At the cathode being the bottom semiconductor die 180a and metal substrate 120, the dissolved metal ions (e.g., $Cu^{+2}$) in the electrolyte solution are reduced at the interface between the plating solution and the cathode, such that they plate out to a zero valence state metal (e.g., Cu metal) as the metal die attach layer 187 onto the cathode. The electroplating is generally performed using direct current (DC), but can also be performed as pulsed electroplating. The time for the electroplating process can be calculated by dividing the desired metal die attach layer 187 thickness by the deposition rate. The metal die attach layer 187 thickness can be 10 to 250 µm thick, for example 40 to 200 µm thick.

The plating cover 160 is then removed with the result shown in FIG. 1E. A wirebonding step then secures bond wires 133 between the example pillars 182a shown on the bond pads 181a and the inner metal pads 125a, with the result shown in FIG. 1F. Adhesive bonding of the top semiconductor die on a bottom semiconductor die for stacked die arrangements is then used, which is known in the art of semiconductor assembly. For example, an adhesive, such as an epoxy or a polyurethane, shown below as 179, can be applied on top side of the bottom semiconductor die 180a while being a tacky adhesive (not fully cured), and then a top semiconductor die 180b is inserted (typically by a pick and place operation) over the adhesive 179, followed by adhesive curing to provide a stacked semiconductor die arrangement. Bonding features, such as solder bumps or pillars, on the bond pads 181b on the top side of the top semiconductor die 180b are then connected to the outer metal pads 125b using pins which are generally bent pins. As an alternative to pillars 182a, the bond pads 181b may be used alone for wire bonding, or they comprise solder bumps on the bond pads 181b.

The pins may be commercially available, such as comprising metal bars that are pre-bent having a desired size (length and width) and providing a desired contour. Pins can alternatively be custom-made. The pins may be soldered onto the bonding features on the on bond pads.

The package(s) is then encapsulated by a molding process to form a molding compound 190, with mold compound as described above also filling the partial etch regions 120c. The molding process is followed by etching the backside of the package to remove relatively thin metal layers (thin compared to the thickness of the metal substrate 120 and the thickness of the BSM layer 186) comprising the metal die attach layer 187 then the partial etch regions 120c to reach the mold compound thereunder 190, where the mold compound 190 as noted above electrically isolates all the metal pads 125a, 125b from one another.

Electrochemical etching also known as electroetching can be used for the backside etching that enables maskless etching for etching through the metal die attach layer 187 over the thin partial etch regions 120c of the metal substrate. Alternatively an etch mask (e.g., a solder mask layer) can be used for the back side etching to etch through the metal die attach layer 187 over the partial etch regions 120c, then through the thickness of the partial etch regions 120c.

Electroetching is a metal etching process that involves the use of a solution of an electrolyte, an anode, and a cathode. The metal article to be electro etched is connected to the positive terminal of a source of direct electric current. A piece of generally the same metal material is connected to the negative terminal of the direct current source and termed the cathode. Similarly the cation of the electrolyte should generally be of the same metal material as well. When the current source is turned on, the metal of the anode is dissolved and converted into the same cation as in the electrolyte and at the same time an equal amount of the cation in the solution is converted into metal and deposited on the cathode.

FIG. 1G is a top perspective view of the leadless packaged multichip device 195 on a metal substrate 120 having a through-hole aperture with an outer ring (see these features in FIG. 1A and FIG. 1B described above), where the top semiconductor die 180b is shown assembled top side up and stacked over and attached to the bottom semiconductor die 180a by an adhesive material (the adhesive not shown in FIG. 1G, but see the adhesive 179 in FIG. 2 described below). The pins 164 shown as bent pins can be seen to provide a connection shown by an example solder connection comprising solder 167 as a bonding feature on the bond pads 181b of the top semiconductor die 180b that extends to couple to the outer metal pads 125b. There is also shown an optional heat spreader 178 on an adhesive (see adhesive 177 in FIG. 2 described below) on top of the top semiconductor die 180b. The heat spreader 178 may optionally be thermally connected to the metal substrate 120, such as by a suitable pin, to improve its cooling function.

FIG. 1H shows a back side perspective view of the leadless packaged multichip device 195 shown in FIG. 1G. Mold compound 190 can be seen exposed on the backside of the device resulting from the above described back side etching through the metal die attach layer 187 then the partial etch regions 120c, positioned to provide electrical isolation between adjacent ones of the metal pads comprising inner metal pads 125a and outer metal pads 125b.

Figure 2:
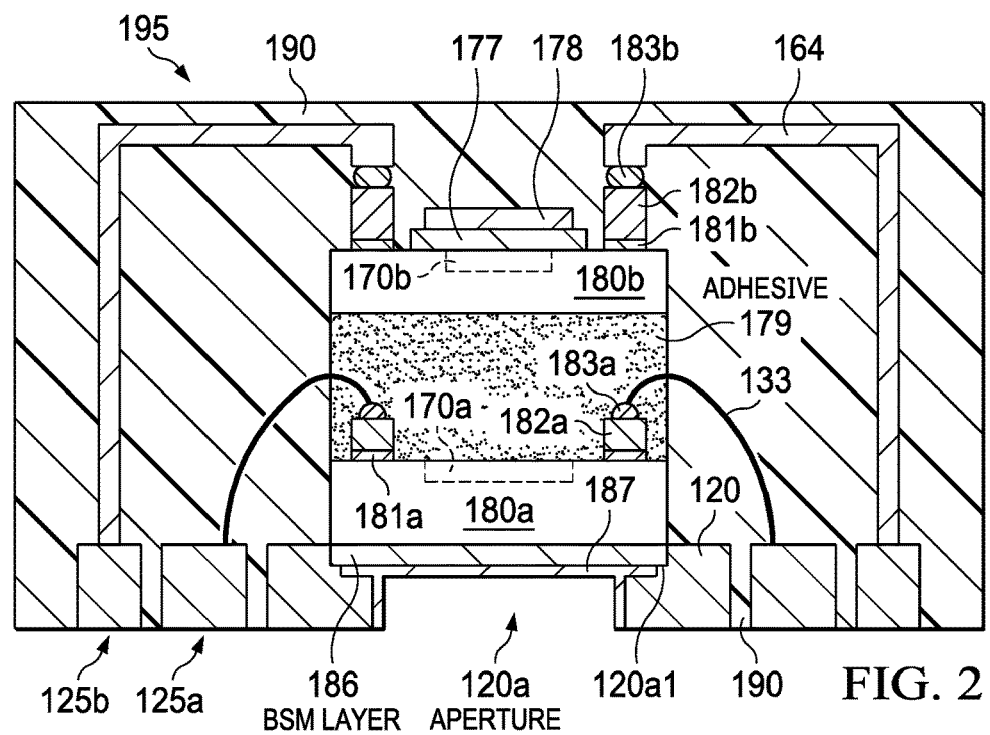
FIG. 2 is a cross-sectional view of a disclosed leadless packaged multichip device having stacked die on a metal substrate having a through-hole aperture with at least two rows of metal pads, with a plated metal die attach layer for attachment of the bottom semiconductor die to the metal substrate.

FIG. 2 is a cross-sectional view of a disclosed leadless packaged multichip device shown as 200 that is similar to the leadless packaged multichip packaged device 195 shown in FIG. 1G and FIG. 1H, with some additional features shown. Stacked top and bottom semiconductor die 180b on 180a are shown, with the bottom semiconductor die 180a on the metal substrate 120 having at least two rows of metal pads comprising inner metal pads 125a and outer metal pad 125b, with a metal die attach layer 187 for the bottom semiconductor die 180a. The metal die attach layer 187 is shown framing the through-hole aperture 120a of the metal substrate 120 under the ring $120a_1$ and on the bottom side of the BSM layer 186. The bottom semiconductor die 180a can be seen to be mounted on the ring $120a_1$ of the through-hole aperture 120a.

Solder 183a is shown on the pillars 182a on the bond pads 181a of the bottom semiconductor die 180a, and solder 183b is shown on the pillars 182b. There is also an adhesive layer 179 between the top side of the bottom semiconductor die 180a and a back side of the top semiconductor due 180b. A heat spreader 178 is secured by an adhesive 177 to a top side of the top semiconductor die 180b. The adhesive 177 can comprise a silver filled epoxy to provide significant thermal conductivity for transferring heat from the top semiconductor die to reach the heat spreader 178, which in some arrangements as noted above extends to contact the metal substrate 120 to enhance the heat transfer.

Disclosed aspects can be integrated into a variety of assembly flows to form a variety of different leadless packaged stacked semiconductor devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

Those skilled in the art to which this Disclosure relates will appreciate that many variations of disclosed aspects are possible within the scope of the claimed invention, and further additions, deletions, substitutions and modifications may be made to the above-described aspects without departing from the scope of this Disclosure.

The invention claimed is:

1. A leadless packaged multichip semiconductor device, comprising:
   a metal substrate having a through-hole aperture that has an outer ring configured for holding a bottom semiconductor die with a plurality of cuts through the metal substrate to define a spaced apart plurality of metal pads on at least two sides of the through-hole aperture including a row of inner metal pads and a row of outer metal pads;
   the bottom semiconductor die having a back side metal (BSM) layer on its bottom side and a top side with circuitry coupled to bond pads mounted top side up on the outer ring;
   a metal die attach layer directly between the BSM layer and walls of the metal substrate bounding the through-hole aperture to provide a die attachment that fills a bottom portion of the through hole aperture;
   bond wires between the inner metal pads and the bond pads,
   a dielectric adhesive on the top side of the bottom semiconductor die;
   a top semiconductor die having a top side with circuitry coupled to top bond pads mounted top side up on the dielectric adhesive over the bottom semiconductor die;
   pins connecting the top bond pads to the outer metal pads, and
   a mold compound including between adjacent ones of the metal pads.

2. The leadless packaged multichip semiconductor device of claim 1, further comprising a heat spreader connected to the outer metal pads that is on the dielectric adhesive.

3. The leadless packaged multichip semiconductor device of claim 1, wherein the metal die attach layer consists of a single layer and is 10 µm to 250 µm thick.

4. The leadless packaged multichip semiconductor device of claim 1, wherein the BSM layer, the metal substrate, and the metal die attach layer all comprise copper.

5. The leadless packaged multichip semiconductor device of claim 1, wherein the metal die attach layer is an electroplated metal layer.

6. The leadless packaged multichip semiconductor device of claim 1, further comprising metal pillars on the bond pads.

7. The leadless packaged multichip semiconductor device of claim 1, wherein the leadless packaged semiconductor device comprises a quad flat no lead (QFN) type package.

8. The leadless packaged multichip semiconductor device of claim 1, wherein the metal die attach layer does not extend out beyond the through-hole aperture.

9. The leadless packaged multichip semiconductor device of claim 1, further comprising a heat spreader on top of the top semiconductor die.

10. A leadless packaged multichip semiconductor device assembly, comprising:
    a metal substrate including a through-hole aperture having an outer ring for receiving a bottom semiconductor die, with metal pads comprising a row of inner metal pads and a row of outer metal pads with partial etch regions in between adjacent ones of the metal pads on at least two sides of the through-hole aperture, with the bottom semiconductor die having a back side metal (BSM) layer on its bottom side and a top side having circuitry coupled to bond pads;
    the bottom semiconductor die top side sitting on the outer ring of the through-hole aperture;
    the bottom semiconductor die secured in the through-hole apertures to provide a stack;
    an electroplated metal die attach layer filling a volume between the BSM layer and walls of the metal substrate bounding the through-hole apertures to provide a die attachment,
    a wirebond between the bonding features on the bond pads to the inner metal pads;
    a dielectric adhesive on the top side of the bottom semiconductor die;
    a top semiconductor die on the dielectric adhesive to provide a stacked die arrangement; and
    a molding compound in the partial etched regions between the metal pads.

11. The leadless packaged multichip semiconductor device of claim 10, wherein the partial etched regions have a thickness that is less than 20% of a thickness of the metal pads before backside etching.

12. The leadless packaged multichip semiconductor device of claim 11, wherein the backside etching comprises a maskless etch.

13. The leadless packaged multichip semiconductor device of claim 12, wherein the backside etching comprises electrochemical etching.

14. The leadless packaged multichip semiconductor device of claim 10, wherein the metal die attach layer consists of a single layer and is 10 μm to 250 μm thick.

15. The leadless packaged multichip semiconductor device of claim 14, wherein the BSM layer, the metal substrate, and the single metal layer all comprise copper.

16. The leadless packaged multichip semiconductor device of claim 10, further comprising a heat spreader on top of the top semiconductor die.

17. The leadless packaged multichip semiconductor device of claim 10, wherein the back side etching the metal die attach layer does not extend out beyond the through-hole aperture after etching.

* * * * *